(12) United States Patent
Grodzki et al.

(10) Patent No.: US 10,185,014 B2
(45) Date of Patent: Jan. 22, 2019

(54) METHOD AND APPARATUS FOR EPI MAGNETIC RESONANCE WITH SLEW RATE CONTROLLED AND KSPACE ENTRY OPTIMIZED

(71) Applicants: Siemens Aktiengesellschaft, München (DE); MRB Forschungszentrum für Magnet-Resonanz-Bayern e.V., Würzburg (DE)

(72) Inventors: David Grodzki, Erlangen (DE); Robin Heidemann, Strullendorf (DE); Martin Ott, Würzburg (DE); David Andrew Porter, Regensburg (DE)

(73) Assignees: Siemens Aktiengesellschaft, Munich (DE); Fraunhofer-Gesellschaft Zur Foerderung Der Angewandten Forschung E.V., Munich (DE)

( * ) Notice: Subject to any disclaimer, the term of this patent is extended or adjusted under 35 U.S.C. 154(b) by 848 days.

(21) Appl. No.: 14/638,237

(22) Filed: Mar. 4, 2015

(65) Prior Publication Data

US 2015/0253408 A1 Sep. 10, 2015

(30) Foreign Application Priority Data

Mar. 4, 2014 (DE) .......................... 10 2014 203 890

(51) Int. Cl.
| | |
|---|---|
| *G01R 33/561* | (2006.01) |
| *G01R 33/30* | (2006.01) |
| *G01R 33/385* | (2006.01) |
| *G01R 33/48* | (2006.01) |
| *G01R 33/54* | (2006.01) |

(52) U.S. Cl.
CPC ....... *G01R 33/5616* (2013.01); *G01R 33/307* (2013.01); *G01R 33/3852* (2013.01); *G01R 33/4818* (2013.01); *G01R 33/543* (2013.01); *G01R 33/5611* (2013.01); *G01R 33/3854* (2013.01)

(58) Field of Classification Search
USPC .......................... 324/300–322; 600/407–435; 382/128–131
See application file for complete search history.

(56) References Cited

U.S. PATENT DOCUMENTS

| | | | |
|---|---|---|---|
| 6,198,289 B1 | 3/2001 | Du et al. | |
| 6,452,391 B1 | 9/2002 | Bernstein et al. | |
| 6,476,607 B1 * | 11/2002 | Dannels ............. | G01R 33/4824 324/307 |

(Continued)

OTHER PUBLICATIONS

De Zwart et al.; "Reduction of Gradient Acoustic Noise in MRI Using SENSE-EPI"; NeuroImage; vol. 16; pp. 1151-1155; (2002).

(Continued)

*Primary Examiner* — Melissa Koval
*Assistant Examiner* — Tiffany Fetzner
(74) *Attorney, Agent, or Firm* — Schiff Hardin LLP

(57) ABSTRACT

In a method and apparatus for magnetic resonance imaging, a particularly quiet magnetic resonance sequence, uses echo-planar imaging with at least one gradient switching in a readout direction, wherein the at least one gradient switching in the readout direction has a slew rate that is less than a maximum slew rate defined by system specification parameters of the magnetic resonance apparatus.

12 Claims, 3 Drawing Sheets

(56) References Cited

U.S. PATENT DOCUMENTS

| | | | |
|---|---|---|---|
| 7,112,965 B2* | 9/2006 | Scheffler | G01R 33/4806 |
| | | | 324/309 |
| 7,205,763 B2 | 4/2007 | Porter | |
| 9,116,219 B1* | 8/2015 | Posse | G01R 33/5608 |
| 9,234,953 B2* | 1/2016 | Labadie | G01R 33/4818 |
| 9,274,195 B2* | 3/2016 | Pfeuffer | G01R 33/4833 |
| 9,581,667 B2* | 2/2017 | Stemmer | G01R 33/5616 |
| 9,739,857 B2* | 8/2017 | Porter | G01R 33/4818 |
| 2001/0010484 A1 | 8/2001 | Takamori et al. | |
| 2005/0242810 A1* | 11/2005 | Scheffler | G01R 33/4806 |
| | | | 324/309 |
| 2009/0285463 A1* | 11/2009 | Otazo | G06T 3/4053 |
| | | | 382/131 |
| 2011/0118587 A1 | 5/2011 | Roemer et al. | |
| 2011/0248714 A1 | 10/2011 | Salomir et al. | |
| 2012/0313641 A1* | 12/2012 | Labadie | G01R 33/4818 |
| | | | 324/309 |
| 2013/0249549 A1* | 9/2013 | Pfeuffer | G01R 33/4833 |
| | | | 324/309 |
| 2013/0271139 A1* | 10/2013 | Grodzki | G01R 33/543 |
| | | | 324/314 |
| 2014/0197834 A1* | 7/2014 | Porter | G01R 33/4818 |
| | | | 324/309 |
| 2014/0232396 A1 | 8/2014 | Grodzki et al. | |
| 2014/0300352 A1* | 10/2014 | Li | G01R 33/5608 |
| | | | 324/309 |
| 2014/0300356 A1* | 10/2014 | Stemmer | G01R 33/5616 |
| | | | 324/309 |
| 2015/0177345 A1 | 6/2015 | Ham | |
| 2015/0253408 A1* | 9/2015 | Grodzki | G01R 33/307 |
| | | | 324/309 |

OTHER PUBLICATIONS

Zapp et al.: "Sinusoidal Echo-Planar Imaging with Parallel Acquisition Technique for Reduced Acoustic Noise in Auditory fMRI", Journal of Magnetic Resonance Imaging, vol. 36, pp. 581-588, 2012; 2012.

Truong et al. "High-Resolution Multishot Spiral Diffusion Tensor Imaging with Inherent Correction of Motion-Induced Phase Errors", Magnetic Resonance in Medicine, pp. 1-7, (2013).

Segbers et al.; "Shaping and Timing Gradient Pulses to Reduce MRI Acoustic Noise"; Magnetic Resonance in Medicine; vol. 64; pp. 546-553; (2010).

* cited by examiner

METHOD AND APPARATUS FOR EPI MAGNETIC RESONANCE WITH SLEW RATE CONTROLLED AND KSPACE ENTRY OPTIMIZED

BACKGROUND OF THE INVENTION

Field of the Invention

The invention concerns a method for magnetic resonance imaging by operation of a magnetic resonance apparatus, as well a magnetic resonance apparatus and a non-transitory, computer-readable storage medium encoded with programming instructions to implement such a method.

Description of the Prior Art

In a magnetic resonance apparatus, also called a magnetic resonance tomography system, the body of a person to be examined, such as a patient, is normally exposed, with a basic field magnet, to a high main magnetic field, for example of 1.5 or 3 or 7 Tesla. In addition, gradient fields are activated by a gradient coil unit. Radio-frequency pulses, in particular excitation pulses, are then transmitted via a radio-frequency antenna unit using suitable antenna devices, that cause nuclear spins of particular atoms to be resonantly excited by these radio-frequency pulses are deflected by a defined flip angle relative to the magnetic field lines of the basic magnetic field. As the nuclear spins relax, radio-frequency signals, known as magnetic resonance signals, are emitted, and are received using suitable radio-frequency antennas and then further processed. Finally the desired image data can be reconstructed from the raw data acquired in this way.

For a particular measurement a specific magnetic resonance sequence, also called a pulse sequence, must be transmitted, which is composed of a sequence of radio-frequency pulses, in particular excitation pulses and refocusing pulses, as well as gradient activations that are appropriately coordinated therewith, and proceed in gradient axes along respective spatial directions. Timed to coincide with this, readout windows are set that define the time periods in which the induced magnetic resonance signals are detected.

The gradient activations of a magnetic resonance sequence are typically defined with respect to gradient amplitude, gradient pulse duration and edge steepness, in other words the first derivative with respect to time dG/dt of the gradient amplitude, normally called the slew rate. In most magnetic resonance sequences, the polarity and strength of the gradients have to be changed at extremely short time intervals. During the switch-over process there is certain distortion and/or expansion of the magnetic coil, so that loud noises arise and patients need noise protection.

In particular the gradient switchings of an echo-planar imaging magnetic resonance sequence, which is typically used in examinations of the head, but also in the abdominal region of the body, have a very high slew rate, so that the execution of the magnetic resonance sequence is typically very loud. Furthermore, strong vibrations of the magnetic resonance apparatus can occur during the execution of a magnetic resonance sequence using echo-planar imaging. The gradient switchings with high slew rates are in this case used in particular during the readout windows of the magnetic resonance sequence. Patients with claustrophobia or who are fundamentally uncomfortable with the magnetic resonance apparatus may in addition be alarmed by loud examinations and/or unknown noises, so that an examination can only be carried out by administering tranquilizers, or is refused outright.

SUMMARY OF THE INVENTION

An object of the invention is to provide a particularly quiet magnetic resonance sequence for echo-planar imaging.

In accordance with the invention, a method for magnetic resonance imaging by operation of a magnetic resonance device uses an echo-planar imaging magnetic resonance sequence with at least one gradient pulse activation in a readout direction, wherein the at least one gradient pulse activation has a slew rate in the readout direction that is less than a maximum slew rate defined by system specification parameters of the magnetic resonance apparatus.

Magnetic resonance image data for an examination object are acquired by execution of the magnetic resonance sequence. The examination object can be a patient, a training person (volunteer) or a phantom.

The magnetic resonance sequence using echo-planar imaging is also called an echo-planar imaging (EPI) sequence. In an EPI sequence such as this, several echoes are generated consecutively using gradient refocusing. Such a sequence of echoes is also called an EPI echo train. An iteration of one line of a k-space to be filled with acquired MR data is carried out between the echoes, typically by gradient activations in a phase-encoding direction.

The magnetic resonance sequence is in particular a diffusion-weighted magnetic resonance sequence. A diffusion-weighted magnetic resonance sequence typically employs diffusion gradients for diffusion encoding of the nuclear spins.

Typically the at least one gradient pulse activation in the readout direction, which inter alia is set during the readout window of the magnetic resonance sequence, has the highest slew rate of the gradient activations of the magnetic resonance sequence. This is because a magnetic resonance sequence with echo-planar imaging advantageously has a short echo time, so that the magnetic resonance image data recorded by execution of such a magnetic resonance sequence has a high image quality, in particular a high signal-to-noise ratio and/or few artifacts. Consequently only a short time window is available for the at least one gradient pulse activation in the readout direction. Conventional magnetic resonance sequences with echo-planar imaging have gradient activations in the readout direction with a slew rate that corresponds to a maximum slew rate, for example 180 mT/(m·ms), predefined by system specification parameters of the magnetic resonance device. Conventional magnetic resonance sequences thus typically make full use of the maximum slew rate of the magnetic resonance device.

To enable the noise of the magnetic resonance sequence to be reduced, in accordance with the invention the at least one gradient pulse activation has a slew rate in the readout direction that intentionally is less than the maximum slew rate predefined by system specification parameters of the magnetic resonance apparatus. The system specification parameters can in this case are specific for particular magnetic resonance devices. The system specification parameters can be stored in a database. The slew rate of the at least one gradient pulse activation in the readout direction can be a maximum of 85 percent, preferably a maximum of 60 percent, advantageously a maximum of 50 percent, most advantageously a maximum of 30 percent, of the maximum slew rate predefined by the system specification parameters of the magnetic resonance device. Thus the slew rate of the at least one gradient pulse activation in the readout direction can be a maximum of 153 mT/(m·ms), preferably a maximum of 108 mT/(m·ms), advantageously a maximum of 90 mT/(m·ms), and most advantageously a maximum of 54 mT/(m·ms).

The reduced slew rate of the at least one gradient pulse activation in the readout direction preferably functions together with an increased echo interval between the echoes of the magnetic resonance sequence. The echo interval can be at least 0.4 ms, preferably at least 0.5 ms, advantageously at least 0.7 ms, and most advantageously at least 0.9 ms. The increased echo interval advantageously results in a reduced bandwidth of the magnetic resonance sequence and thus in an improvement in the signal-to-noise ratio of the magnetic resonance sequence.

The reduced slew rate of the at least one gradient pulse activation in the readout direction typically functions together with a reduced noise level during acquisition of magnetic resonance image data by execution of the magnetic resonance sequence. The noise level can be a maximum of 95 dB, preferably a maximum of 90 dB, advantageously a maximum of 85 dB, and most advantageously a maximum of 80 dB. In particular the magnetic resonance sequence can have an echo spacing such that the acquisition of magnetic resonance image data by execution of the magnetic resonance sequence results in a noise with a maximum of the aforementioned levels. To this end, the echo interval of the magnetic resonance sequence can be iteratively increased, until the noise has the maximum aforesaid volume.

The magnetic resonance image data acquired by execution of the magnetic resonance sequence can have a high image quality despite the reduced slew rate of the at least one gradient pulse activation and the associated increased echo interval. For this purpose, the magnetic resonance sequence can have as small an echo time as possible despite the increased echo interval. The magnetic resonance sequence can have an echo time of a maximum of 100 ms, preferably a maximum of 90 ms, advantageously a maximum of 80 ms, and most advantageously a maximum of 70 ms. Opportunities for reducing the echo time of the magnetic resonance sequence, for example by using partial-Fourier scanning and/or parallel imaging, are described below.

The magnetic resonance sequence according to the invention makes it possible to acquire magnetic resonance image data with a reduced noise volume and reduced load for the magnetic resonance apparatus, so the magnetic resonance image data has a uniform image quality.

In an embodiment, the magnetic resonance sequence causes the acquired MR data to be entered in k-space in segments in the readout direction. Such a magnetic resonance sequence is also called a readout-segmented echo-planar imaging sequence (rs-EPI sequence). Unlike a single-shot echo-planar-imaging sequence (ss-EPI sequence), in which the entirety of k-space that is to be scanned is filled during a repetition time, in an rs-EPI sequence, k-space is segmented in the readout direction during scanning thereof. Thus in an rs-EPI sequence k-space to be scanned is typically filled in several readout trains. During each readout train the entire k-space width to be scanned is typically filled in the phase encoding direction, although only a part of the entire k-space width to be scanned is filled in the readout direction. During each readout train, a different part of the entire k-space width to be scanned is filled in the readout direction. The use of the low slew rate and of the increased echo interval is particularly advantageous in the case of a magnetic resonance sequence with segmentation of the data entry into k-space to be scanned in the readout direction, because such an rs-EPI sequence permits shorter echo times and thus can result in magnetic resonance image data with a high image quality. The segmentation of k-space to be scanned in the readout direction can advantageously be combined with partial Fourier scanning of k-space to be scanned as described below.

In an embodiment, the magnetic resonance sequence uses partial Fourier scanning of k-space to be scanned. This means that not the entirety of k-space to be scanned is actually filled. In particular, a rectangular k-space is scanned. Advantageously only part of k-space to be scanned is filled in the phase-encoding direction, for example ⅞ the width of k-space to be scanned. Advantageously the partial Fourier scanning can be combined with the segmentation of k-space to be scanned in the readout direction. The start of each readout train is then omitted during the scanning. Thus in the phase-encoding direction, part of k-space to be scanned, which would be acquired prior to the echo, is omitted. Thus the echo time of the magnetic resonance sequence can be particularly advantageously shortened.

In another embodiment, the magnetic resonance sequence employs echo-planar imaging with at least one constant gradient activation in the phase-encoding direction. In particular the constant gradient activation in the phase-encoding direction is employed instead of so-called discrete gradient activations in the phase-encoding direction, known as phase encoding blips. Advantageously this results, in particular during a readout train, in a constant incrementation of the k-space lines in the phase-encoding direction. Thus k-space to be scanned is filled in the form of zigzag scanning (zigzag trajectory). The constant gradient activation in the phase-encoding direction advantageously results in a particularly low noise volume of the magnetic resonance sequence. The sudden and particularly loud switching-on and switching-off of the phase-encoding blips can be omitted.

In another embodiment, the at least one gradient pulse activation is sinusoidal in the readout direction. Because this results in a sudden gradient activation in the readout direction being avoided, so the at least one sinusoidal gradient activation in the readout direction advantageously results in a particularly low noise volume of the magnetic resonance sequence.

In a further embodiment, the magnetic resonance sequence causes the acquired MR data to be entered into several subregions of k-space to be scanned, wherein these several subregions of k-space are combined to form merged k-space, and data in merged k-space are Fourier-transformed into magnetic resonance image data. The several subregions of k-space are preferably combined to form merged k-space by a weighted addition. In this case, k-space lines actually filled can be given a higher weighting than calculated (interpolated) k-space lines. Initially in each case, an individual image can be reconstructed from each individual one of the several subregions of the k-space, so that several individual images are produced, and can again be back-transformed to form several k-spaces, which are ultimately merged. During the reconstruction of the several individual images, necessary phase corrections for each individual image can be carried out individually. The several subregions of k-space are advantageously recorded using an extended echo interval and lower slew rates. Thus the recording of the several subregions of k-space advantageously results in a low noise volume of the magnetic resonance sequence.

In another embodiment, the magnetic resonance sequence implements parallel imaging via multiple reception coil channels, with different coil channels being used to acquire the respective multiple subregions of k-space. Thus parallel imaging can be combined with the acquisition of the multiple subregions of k-space. In particular, an acceleration factor for the parallel imaging can be adjusted to the number of subregions of k-space to be scanned. The more subregions that are to be filled, the higher the acceleration factor can be set. The individual images, which are initially reconstructed separately from each subregion of k-space, then typically initially have a reduced image quality because of the parallel imaging, in particular a reduced signal-to-noise ratio. Furthermore, the image quality may be reduced by a g-factor, which depends on a coil geometry of the coil channels. Merging the subregions of k-space ensures that the image quality of the magnetic resonance image data acquired by execution of the magnetic resonance sequence is maintained. The use of parallel imaging may have the benefit that the magnetic resonance sequence may advantageously have an extended echo interval, reduced slew rates and thus a lower noise volume.

In an embodiment, different phase lines are filled alternately in each case in the multiple subregions of k-space. Thus the multiple subregions are disjoint. Thus the multiple subregions complement one another in the merging of the multiple subregions, so that the magnetic resonance image data has a particularly high image quality.

Furthermore, the invention concerns a magnetic resonance apparatus with a computer and an image data acquisition unit, designed to perform an inventive method. The magnetic resonance apparatus is thus designed to perform a method for magnetic resonance imaging using an echo-planar imaging magnetic resonance sequence with at least one gradient pulse activation in a readout direction, wherein the at least one gradient pulse activation in the readout direction has a slew rate that is less than a maximum slew rate defined by system specification parameters of the magnetic resonance apparatus.

Embodiments of the magnetic resonance apparatus are designed according to the embodiments of the inventive method. The computer can have further control components that are necessary and/or advantageous for performing the inventive method. The computer is designed to transmit control signals to the magnetic resonance device and/or to receive and/or process control signals in order to perform the inventive method. Computer programs and other software can be stored on a memory unit of the computer, by means of which a processor of the computer automatically controls and/or executes a method sequence of an inventive method. The computer can be integrated into the magnetic resonance apparatus. The computer can also be installed separately from the magnetic resonance device. The computer can be connected to the magnetic resonance device.

The inventive storage medium can be loaded directly into a memory of a programmable control device of a magnetic resonance device and has program code in order to cause the inventive method to be executed by the magnetic resonance apparatus. The inventive method thus can be performed quickly and robustly, and can be identically repeated. The inventive method steps are executed by the control computer. The control computer must have, for example, a main memory, graphics card or logic unit, so that the respective method steps can be executed efficiently. Examples of electronic readable data carriers are a DVD, a magnetic tape or a USB stick on which electronically readable control information, in particular software (see above) is stored.

The advantages of the inventive magnetic resonance apparatus and of the inventive storage medium essentially correspond to the advantages of the inventive method, as explained above in detail. Features, advantages or alternative embodiments mentioned here are likewise also applicable. The functional features of the method are embodied by appropriate objective modules, in particular by hardware modules.

DESCRIPTION OF THE PREFERRED EMBODIMENTS

Figure 1:
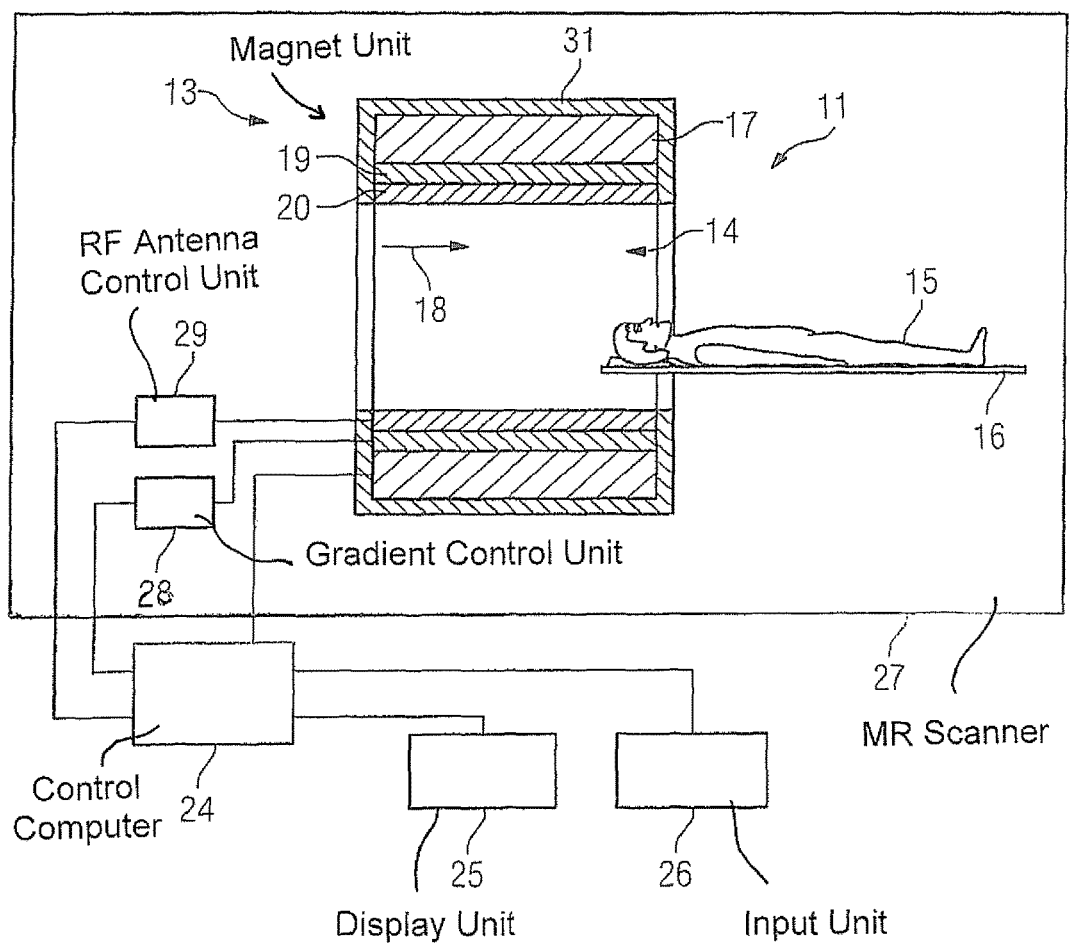
FIG. 1 schematically shows an inventive magnetic resonance device for the performance of an inventive method.

FIG. 1 schematically illustrates an inventive magnetic resonance apparatus 11. The magnetic resonance apparatus 11 has a data acquisition unit formed by a magnet unit 13, having a basic field magnet 17 for generating a strong and constant basic magnetic field 18. The magnetic resonance apparatus 11 additionally has a patient receiving zone 14 in the shape of a cylinder for receiving an examination object, in particular a patient 15, the patient receiving zone 14 being cylindrically surrounded by the magnet unit 13 in a circumferential direction. The patient 15 can be introduced into the patient receiving zone 14 by a patient positioning apparatus 16 of the magnetic resonance device 11. To this end the patient positioning apparatus 16 has a bed, which is disposed in a movable manner within the magnetic resonance device 11. The magnet unit 13 is shielded to the outside by a housing shell 31 of the magnetic resonance device.

The magnet unit 13 additionally has a gradient coil unit 19 for generating magnetic field gradients, which are used for spatial encoding during an imaging session. The gradient coil unit 19 is controlled by means of a gradient control unit 28. The magnet unit 13 also has a radio-frequency antenna unit 20, which in the case shown is designed as a body coil permanently integrated into the magnetic resonance device 10, and a radio-frequency antenna control unit 29 for stimulating a polarization which becomes established in the basic magnetic field 18 generated by the main magnet 17. The radio-frequency antenna unit 20 is controlled by the radio-frequency antenna control unit 29 and radiates radio-frequency magnetic resonance sequences into an examination space that is substantially formed by the patient receiving zone 14. The radio-frequency antenna unit 20 is further designed to receive magnetic resonance signals, in particular from the patient 15.

For controlling the main magnet 17, the gradient control unit 28 and the radio-frequency antenna control unit 29, the magnetic resonance device 11 has a control computer 24. The control computer 24 is used for central control of the magnetic resonance device 11, such as performing a predetermined imaging gradient echo sequence for example. Control information such as imaging parameters, for example, as well as reconstructed magnetic resonance images can be displayed on a display unit 25, for example on at least one monitor, of the magnetic resonance apparatus 11 for viewing by a user. Furthermore, the magnetic resonance device 11 has an input unit 26, by means of which information and/or parameters can be entered by a user during a measurement procedure.

The magnet unit 13, the gradient control unit 28 and the radio-frequency antenna control unit 29 form a scanner 27 of the magnetic resonance device. The magnetic resonance device 11 is thus designed, together with the computer 24 and the scanner 27, to perform the inventive method.

The magnetic resonance apparatus 11 has system specification parameters that predefine a maximum slew rate. The maximum slew rate can depend on, for example, the gradient coil unit 19 and can be higher if the gradient coils of the gradient coil unit 19 can be switched faster.

The magnetic resonance device 11 shown can have further components that magnetic resonance apparatuses typically include. Furthermore, the general operation of a magnetic resonance apparatus is known to those skilled in the art, so a detailed description of the other components is not necessary herein.

Figure 2:
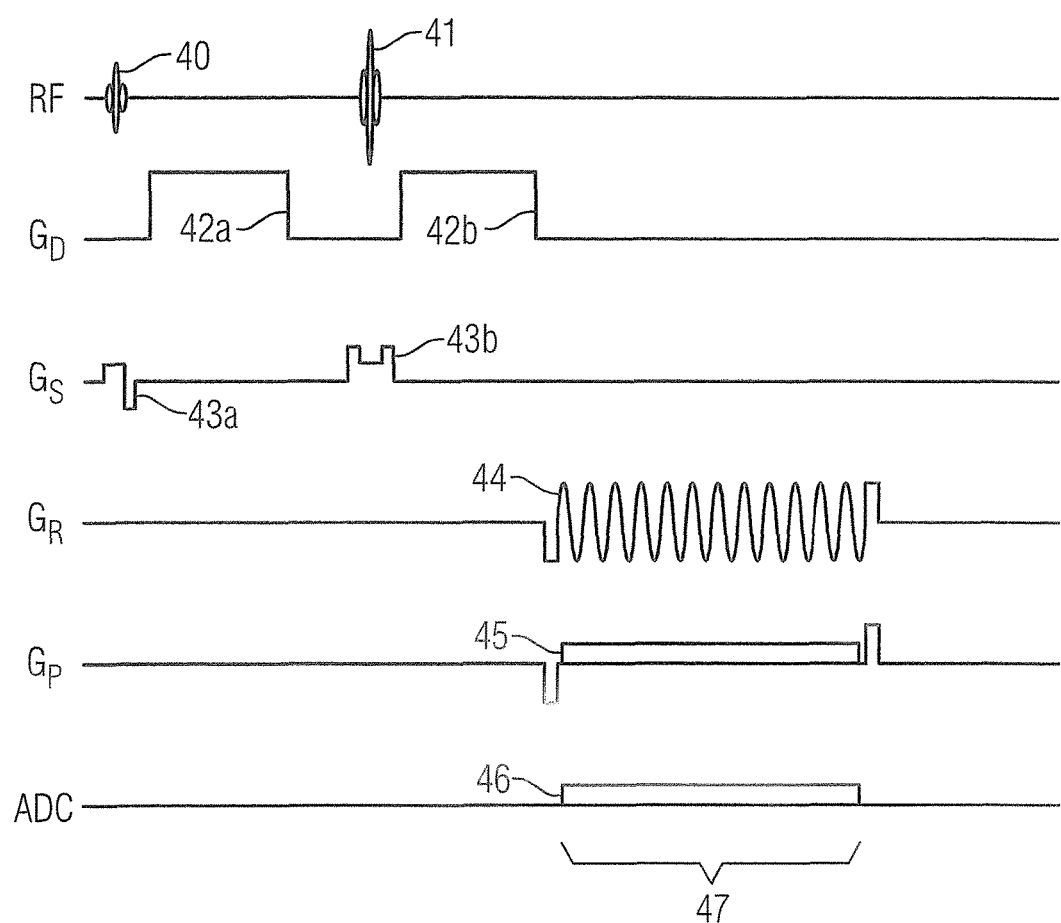
FIG. 2 shows a sequence diagram of a magnetic resonance sequence according to one embodiment of an inventive method.

FIG. 2 shows a sequence diagram of a magnetic resonance sequence according to one embodiment of an inventive method. The magnetic resonance shown employs echo-planar imaging with a gradient switching 44 in the readout direction. In the case shown the magnetic resonance sequence is a diffusion-weighted magnetic resonance sequence. Other types of magnetic resonance sequences using echo-planar imaging are also conceivable, as appears expedient to those skilled in the art. The magnetic resonance sequence shown can be employed for magnetic resonance imaging by operation of the magnetic resonance apparatus 11. To this end the magnetic resonance sequence shown has a chronological sequence of radio-frequency pulses and gradient switchings. Based on this, the gradient control unit 28 and the radio-frequency antenna control unit 29 control the gradient coil unit 19 and radio-frequency antenna unit 20.

In the somewhat simplified sequence diagram shown in FIG. 2 the readout windows, the radio-frequency pulses to be transmitted and the gradient switchings are each represented in the customary manner on different, overlapping time axes as a function of the time t. The amplitudes of the radio-frequency pulses to be transmitted by the radio-frequency antenna unit 20 are represented on the top radio-frequency pulse time axis RF. The diffusion gradient switchings to be transmitted by means of the gradient coil unit 19 are represented on the diffusion gradient axis $G_D$ below this. The gradient switchings to be transmitted in the slice selection direction by the gradient coil unit 19 are represented on the slice selection gradient axis $G_S$ below this. The gradient switchings to be transmitted in the readout direction by means of the gradient coil unit 19 are represented on the readout gradient axis $G_R$ below this. The gradient switchings to be transmitted in the phase encoding direction by means of the gradient coil unit 19 are represented on the phase-encoding gradient axis $G_P$ below this. Readout windows during which the radio-frequency antenna unit 20 is switched to receive are represented on the bottommost readout time axis ADC. For simplification purposes the scaling in the time direction and amplitude direction takes place only in random units on all axes of the sequence diagram.

The magnetic resonance sequence starts in the case shown with an excitation pulse 40, which by way of example has a flip angle of 90 degrees. During this, a first slice selection gradient switching 43a is utilized, so that the excitation pulse 40 works slice-selectively. This is followed by a first diffusion gradient switching 42a. Then follows a refocusing pulse 41, which by way of example has a flip angle of 180 degrees. During this, a second slice selection gradient switching 43b is utilized, so that the refocusing pulse 41 works slice-selectively. This is followed in the case shown by a readout train 47 of echo-planar imaging, known as an EPI readout train 47.

The EPI readout train 47 has a readout gradient switching 44 in the readout direction, a phase encoding gradient switching 45 in the phase-encoding direction and a switched readout window 46. The readout gradient switching 44, the phase-encoding gradient switching 45 and the readout window 46 take place at the same time. The readout gradient switching 44 is in particular designed to be sinusoidal. Furthermore, the readout gradient switching 44 has a slew rate which is less than a maximum slew rate (see description for FIG. 1) predefined by system specification parameters of the magnetic resonance device 11. The phase-encoding gradient switching 45 is in particular designed to be constant. Thus the readout gradient switching 44 and the phase-encoding gradient switching 45 are designed to be particularly quiet.

Figure 3:
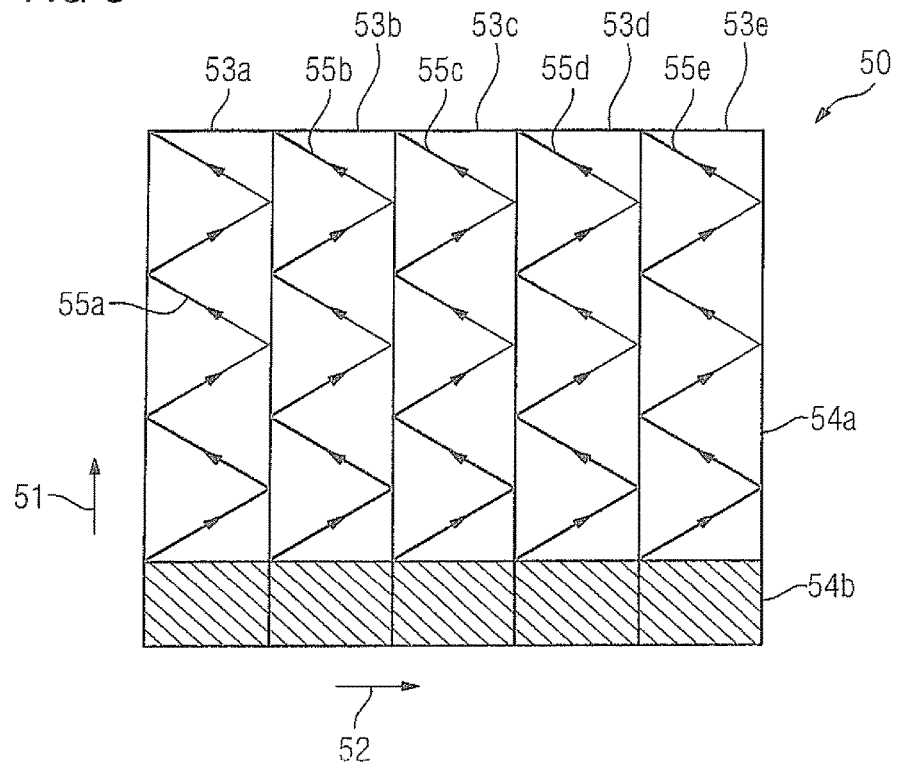
FIG. 3 shows data entry into k-space to be scanned according to one embodiment of an inventive method.

FIG. 3 shows data entry into an electronic memory organized as k-space 50 to be scanned according to one embodiment of an inventive method. K-space 50 is scanned according to the magnetic resonance sequence illustrated in the sequence diagram of FIG. 2. K-space 50 has lines that are arranged along a phase-encoding direction 51. K-space 50 has columns that are arranged along a readout direction 52.

The magnetic resonance sequence illustrated provides for segmentation data entry into k-space 50 in the readout direction 52. Thus, k-space 50 is scanned in several readout trains (shots) 55a,55b,55c,55d,55e. In the case shown, k-space 50 is segmented as an example along the readout direction 52 into five segments 53a,53b,53c,53d,53e. Thus in the case shown, k-space 50 is scanned (filled with acquired MR data) in five shots 55a,55b,55c,55d,55e, wherein during each shot 55a,55b,55c,55d,55e a segment 53a,53b,53c,53d,53e of k-space 50 is scanned in the readout direction 52. It is of course also possible for a different number of segments 53a,53b,53c,53d,53e to be present. Use of a magnetic resonance sequence that is not illustrated is also conceivable, that causes the entirety of k-space 50 to be filled in one pass.

Furthermore, in the case shown the magnetic resonance sequence provides for partial Fourier scanning of k-space 50. For this, k-space 50 is divided along the phase-encoding direction 51 into a first subregion 54a and a second subregion 54b. The second subregion 54b includes in this example at least ⅛ of the length of k-space to be scanned in the phase-encoding direction 51. The first subregion 54a is scanned during the readout of the magnetic resonance signals, whereas the second subregion 54b is not scanned.

During each shot 55a,55b,55c,55d,55e a segment of k-space 50 is accordingly scanned, which is delimited in the phase-encoding direction 51 by the borders of the first subregion 54a and in the readout direction 52 by the borders of the respective segment 53a,53b,53c,53d,53e of k-space 50. Because of the exemplary constant phase-encoding gradient switching 45 the shots 55a,55b, 55c,55d,55e follow a zigzag motion through the respective segment 53a,53b, 53c,53d,53e of k-space 50. The shots 55a,55b,55c,55d,55e pass through k-space 50 along the arrow direction indicated. Thus, due to the partial Fourier scanning of k-space 50 in the shown example, in each case the beginning of the shots 55a,55b,55c,55d,55e is not scanned, since this lies in the second subregion 54b. This is a particularly advantageous procedure, since the echo time of the magnetic resonance sequence can be further reduced thereby.

Figure 4:
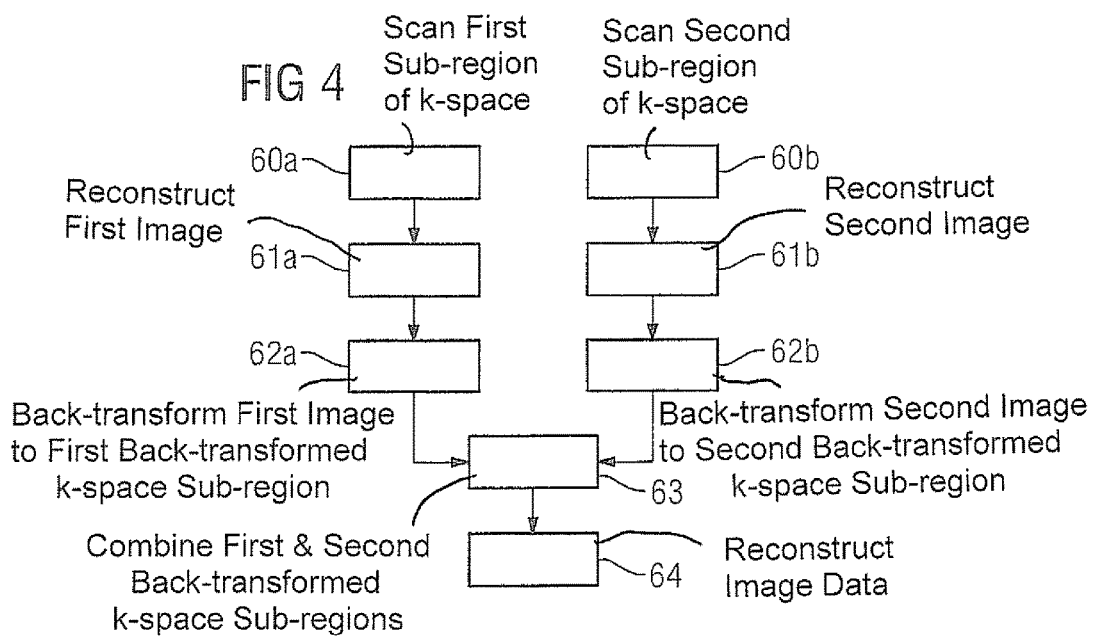
FIG. 4 is a flowchart of the scanning of several subregions of k-space according to another embodiment of an inventive method.

FIG. 4 is a flowchart of scanning of several subregions of k-space according to an embodiment of an inventive method. The procedure set out below is optional and may result in an additional reduction in noise during the acquisition of the magnetic resonance image data. In particular, the procedure set out below can be combined with any other elements already illustrated, for example partial Fourier scanning of k-space.

In a first method step 60a,60b two subregions of k-space are recorded. In a first substep 60a the first subregion of k-space is scanned and in a second substep 60b the second subregion of k-space is scanned. During the scanning of the subregions of k-space, the magnetic resonance sequence employs parallel imaging via two coil channels, wherein different coil channels are employed for detecting the signals that are entered as MR data into the two subregions of k-space.

In the case shown, two subregions are scanned for clarity. A different number of subregions can of course also be scanned. The procedure is presented merely as an example on the basis of two subregions. Furthermore, two coil channels are employed as an example. A different number of coil channels can of course also be employed. At least one coil channel must be employed for scanning a subregion. Furthermore, different phase lines are advantageously filled alternately in each case in the two subregions of k-space.

The parallel imaging here has an acceleration factor that is twice as high as a standard acceleration factor according to the clinical protocol of the magnetic resonance sequence. For example, an acceleration factor of four can be used. If a different number of subregions is scanned, the acceleration factor is then advantageously a multiple of the standard acceleration factor according to the clinical protocol of the magnetic resonance sequence, wherein the multiple corresponds to the number of subregions.

In another method step 61a,61b an individual image is in each case reconstructed from a subregion of k-space. In a first substep 61a a first individual image is reconstructed from the first subregion of k-space and in a second substep 61b a second individual image is reconstructed from the second subregion of k-space. Corrections, in particular phase corrections, are applied during the reconstruction of the individual images.

In another method step 62a,62b each individual image is back-transformed to form a back-transformed subregion of k-space. In a first substep 62a the first individual image is back-transformed to form a first back-transformed subregion of k-space and in a second substep 62b the second individual image is back-transformed to form a second back-transformed subregion of k-space. The back-transformed subregions of the k-space to be recorded are now corrected, in particular in respect of phase corrections.

In another method step 63 the back-transformed subregions of k-space are combined to form merged k-space, in particular by a weighted addition.

In another method step 64 magnetic resonance image data are reconstructed from merged k-space.

The acquisition sequence shown in FIG. 2, the scanning of k-space shown in FIG. 3, and the sequence diagram shown in FIG. 4 according to one embodiment of the inventive method are performed by the magnetic resonance apparatus 11. To this end the magnetic resonance apparatus 11 has the requisite software and/or computer programs, which are stored in a storage unit of the magnetic resonance apparatus 11. The software and/or computer programs include program code designed to perform the inventive method, when the computer program and/or the software is executed in the magnetic resonance apparatus 11 by the computer 24 of the magnetic resonance apparatus 11.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for acquiring magnetic resonance (MR) data comprising:
   from a control computer, operating an MR data acquisition unit comprising a gradient coil system, while an examination subject is situated in the MR data acquisition unit, in order to execute an echo-planar imaging (EPI) sequence, comprising at least one gradient switching in a readout direction implemented by said gradient coil system so as to acquire MR data from the subject;
   from said control computer, reducing audible noise during said EPI sequence by operating said gradient coil system with said at least one gradient switching in the readout direction having a slew rate that is no more than 85% of a maximum slew rate that is defined by system specification parameters of said MR data acquisition unit;
   from said control computer, entering the acquired MR data into an electronic memory organized as k-space; and
   via said control computer, making the MR data entered into k-space in said electronic memory available as an output in electronic form as a data file.

2. A method as claimed in claim 1 comprising, from said control computer, operating said MR data acquisition unit with a readout-segmented EPI (rs-EPI) sequence as said EPI sequence, and entering said MR data into said electronic memory organized as k-space in respective segments of k-space in said readout direction.

3. A method as claimed in claim 1 comprising, from said control computer, operating said MR data acquisition unit according to said echo-planar imaging sequence with partial Fourier scanning of k-space.

4. A method as claimed in claim 1 comprising, from said control computer, operating said MR data acquisition unit according to said echo-planar imaging sequence by operating said gradient coil system with at least one constant gradient switching in a phase-encoding direction.

5. A method as claimed in claim 1 comprising, from said control computer, operating said gradient coil system to implement said at least one gradient switching in the readout direction as a sinusoidal gradient switching.

6. A method as claimed in claim 1 comprising, from said control computer, entering the MR data acquired in said echo-planar imaging sequence into k-space in respective subregions of k-space and, in said control computer, merging said respective subregions of k-space to form merged k-space and making said merged k-space available at said output of said computer as said data file.

7. A method as claimed in claim 6 wherein said MR data acquisition unit comprises a plurality of reception coil channels and, from said control computer, operating said MR data acquisition unit in said echo-planar imaging sequence with parallel imaging wherein said MR data are acquired in parallel by multiple coil channels among said plurality of coil channels, with MR data respectively acquired by said multiple coil channels being respectively entered into said respective subregions of k-space.

8. A method as claimed in claim 6 wherein said electronic memory is organized as k-space comprising a plurality of k-space lines in a phase-encoding direction and, from said control computer, entering the acquired MR data into k-space in different k-space lines alternatingly in each of said subregions.

9. A magnetic resonance (MR) apparatus comprising:
an MR data acquisition unit, comprising a gradient coil system, said MR data acquisition unit and said gradient coil system, in combination, exhibiting system specification parameters that define a maximum slew rate for gradient switchings implemented by said gradient coil system;
an electronic memory organized as k-space;
a control computer configured to operate the MR data acquisition unit, while an examination subject is situated in the MR data acquisition unit, in order to execute an echo-planar imaging (EPI) sequence, comprising at least one gradient switching in a readout direction implemented by said gradient coil system so as to acquire MR data from the subject;
said control computer being configured to reduce audible noise during said EPI sequence by operating said gradient coil system with said at least one gradient switching in the readout direction having a slew rate that is no more than 85% of said maximum slew rate that defined by said system specification parameters of said MR data acquisition unit;
said control computer being configured to enter the acquired MR data into said electronic memory organized as k-space; and
said control computer being configured to make the MR data entered into k-space in said electronic memory available as an output in electronic form as a data file.

10. A non-transitory, computer-readable data storage medium encoded with programming instructions, said storage medium being loaded into a control computer of a magnetic resonance (MR) apparatus that comprises an MR data acquisition unit comprising a gradient coil system, said MR data acquisition unit and said gradient coil system, in combination, exhibiting system specification parameters that define a maximum slew rate for gradient switchings implemented by said gradient coil system, and said MR apparatus comprising an electronic memory organized as k-space, said programming instructions causing said control computer to:
operate the MR data acquisition unit, while an examination subject is situated in the MR data acquisition unit, in order to execute an echo-planar imaging (EPI) sequence, comprising at least one gradient switching in a readout direction implemented by said gradient coil system so as to acquire MR data from the subject;
reduce noise during said EPI sequence by operating said gradient coil system with said at least one gradient switching in the readout direction having a slew rate that is no more than 85% of said maximum slew rate defined by said system specification parameters of said MR data acquisition unit and said gradient coil system;
enter the acquired MR data into said electronic memory organized as k-space; and
make the MR data entered into k-space in said electronic memory available as an output in electronic form as a data file.

11. An MR apparatus as claimed in claim 9 wherein said control computer is configured to operate said MR data acquisition unit with a readout-segmented EPI (rs-EPI) sequence as said EPI sequence, and to enter said MR data into said electronic memory organized as k-space in respective segments of k-space in said readout direction.

12. A non-transitory, computer-readable data storage medium encoded as claimed in claim 10, wherein said programming instructions cause said control computer to operate said MR data acquisition unit with a readout-segmented EPI (rs-EPI) sequence as said EPI sequence, and to enter said MR data into said electronic memory organized as k-space in respective segments of k-space in said readout direction.

* * * * *